US011264352B2

(12) United States Patent
Wu et al.

(10) Patent No.: US 11,264,352 B2
(45) Date of Patent: Mar. 1, 2022

(54) ELECTRONIC PACKAGE STRUCTURE WITH A CORE GROUND WIRE AND CHIP THEREOF

(71) Applicant: REALTEK SEMICONDUCTOR CORP., Hsinchu (TW)

(72) Inventors: Ting-Ying Wu, Hsinchu County (TW); Chien-Hsiang Huang, Hsinchu County (TW); Chin-Yuan Lo, Hsinchu (TW); Chih-Wei Chang, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 56 days.

(21) Appl. No.: 16/897,424

(22) Filed: Jun. 10, 2020

(65) Prior Publication Data
US 2020/0402948 A1    Dec. 24, 2020

(30) Foreign Application Priority Data

Jun. 19, 2019  (TW) .................................. 108121277

(51) Int. Cl.
*H01L 23/00*        (2006.01)
(52) U.S. Cl.
CPC .............. *H01L 24/46* (2013.01); *H01L 24/06* (2013.01); *H01L 2224/06515* (2013.01)

(58) Field of Classification Search
CPC ......... H01L 24/06; H01L 24/09; H01L 24/14; H01L 24/17; H01L 24/30; H01L 24/33; H01L 24/40; H01L 24/46; H01L 24/49
See application file for complete search history.

(56) References Cited

U.S. PATENT DOCUMENTS

| | | | |
|---|---|---|---|
| 10,211,141 B1 * | 2/2019 | Fillion | .............. H01L 23/49838 |
| 2011/0180940 A1 | 7/2011 | Oikawa | |
| 2012/0273972 A1 | 11/2012 | Kawai | |

* cited by examiner

*Primary Examiner* — Hoai V Pham
(74) *Attorney, Agent, or Firm* — Li & Cai Intellectual Property (USA) Office

(57) ABSTRACT

An electronic package structure and a chip thereof are provided. The electronic package structure includes a substrate, a chip, a plurality of signal wires, and a core ground wire. The chip disposed on and electrically connected to the substrate has a core wiring region and an input and output pad region located at a top surface thereof. The input and output pad region is located between the core wiring region and an edge of the chip. The chip includes a plurality of signal pads in the input and output region and a core ground pad adjacent to one of the signal pads. The core ground pad located in the core wiring region. The signal wires are respectively connected to the signal pads. The core ground wire connected to the core ground pad is adjacent to and shields one of the signal wires.

13 Claims, 5 Drawing Sheets

ELECTRONIC PACKAGE STRUCTURE WITH A CORE GROUND WIRE AND CHIP THEREOF

CROSS-REFERENCE TO RELATED PATENT APPLICATION

This application claims the benefit of priority to Taiwan Patent Application No. 108121277, filed on Jun. 19, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic package structure and a chip thereof, and more particularly to an electronic package structure and a chip thereof by using a wire bonding technique.

BACKGROUND OF THE DISCLOSURE

An integrated circuit package component that is packaged by using a wire bonding technique includes a core region and an input/output pad array surrounding the core region. Furthermore, the integrated circuit package component usually includes a plurality of bonding wires which are respectively connected to the input/output pads, so that an IC chip packaged therein can be electrically connected to a substrate or another electronic device by the bonding wires.

Generally, a portion of the bonding wires are ground bonding wires to prevent crosstalk among other signal bonding wires that are configured to transmit signals, in which the crosstalk may negatively affect the signal transmission quality. However, the more functions the IC chip is required to have, the more input/output pads the integrated circuit package component needs.

With consideration to the integrity of the signal bonding wires in signal transmission, it is necessary to additionally increase the numbers of the ground pads and the ground bonding wires so that the power consumption or crosstalk among the signal bonding wires can be reduced during the signal transmission. However, the number of the input/output pads that is arranged in a peripheral region of the core region is limited to the size of the IC chip. If the number of the ground pads is increased, the size of the IC chip would have to be increased as well. Therefore, the fabrication cost is significantly increased, and it would be difficult for the integrated circuit package component to develop toward being light, thin, short, and small in size, as is the current trend.

However, if the number of the ground pads is not increased to avoid increasing the size of the IC chip, a portion of the signal bonding wires for signal transmission would be coupled to each other such that the quality of signal transmission is reduced.

SUMMARY OF THE DISCLOSURE

In response to the above-referenced technical inadequacies, the present disclosure provides an electronic package structure and a chip thereof, in which the quality of signal transmission can be maintained without increasing the size of the chip.

In one aspect, the present disclosure provides an electronic package structure including a substrate, a chip, a plurality of signal wires, and a core ground wire. The chip is disposed on and electrically connected to the substrate. A top surface of the chip is disposed with a core wiring region and an input and output pad region, and the input and output pad region is located between the core wiring region and an edge of the chip. The chip includes a plurality of signal pads disposed in the input and output region and a core ground pad disposed in the core wiring region and adjacent to at least one of the signal pads. The signal wires are respectively connected to the signal pads, and the core ground wire is connected to the core ground pad. The core ground wire is adjacent to at least one of the signal wires so as to shield the at least one of the signal wires.

In one aspect, the present disclosure provides a chip including a core wiring region, an input and output pad region, a plurality of signal pads, and a core ground pad which are arranged at a top surface of the chip. The signal pads are arranged in the input and output pad region, and the core ground pad is disposed in the core wiring region and adjacent to one of the signal pads.

Therefore, one of the advantages of the present disclosure is that in an electronic package structure and a chip thereof, by the technical features of "the core ground pad being disposed in the core wiring region and being adjacent to at least one of the signal pads," the core ground pad and the core ground wire that is connected thereto can jointly shield one of the signal pads and the signal wires that are connected thereto, thereby substantially maintaining the signal integrity without increasing the size of the chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
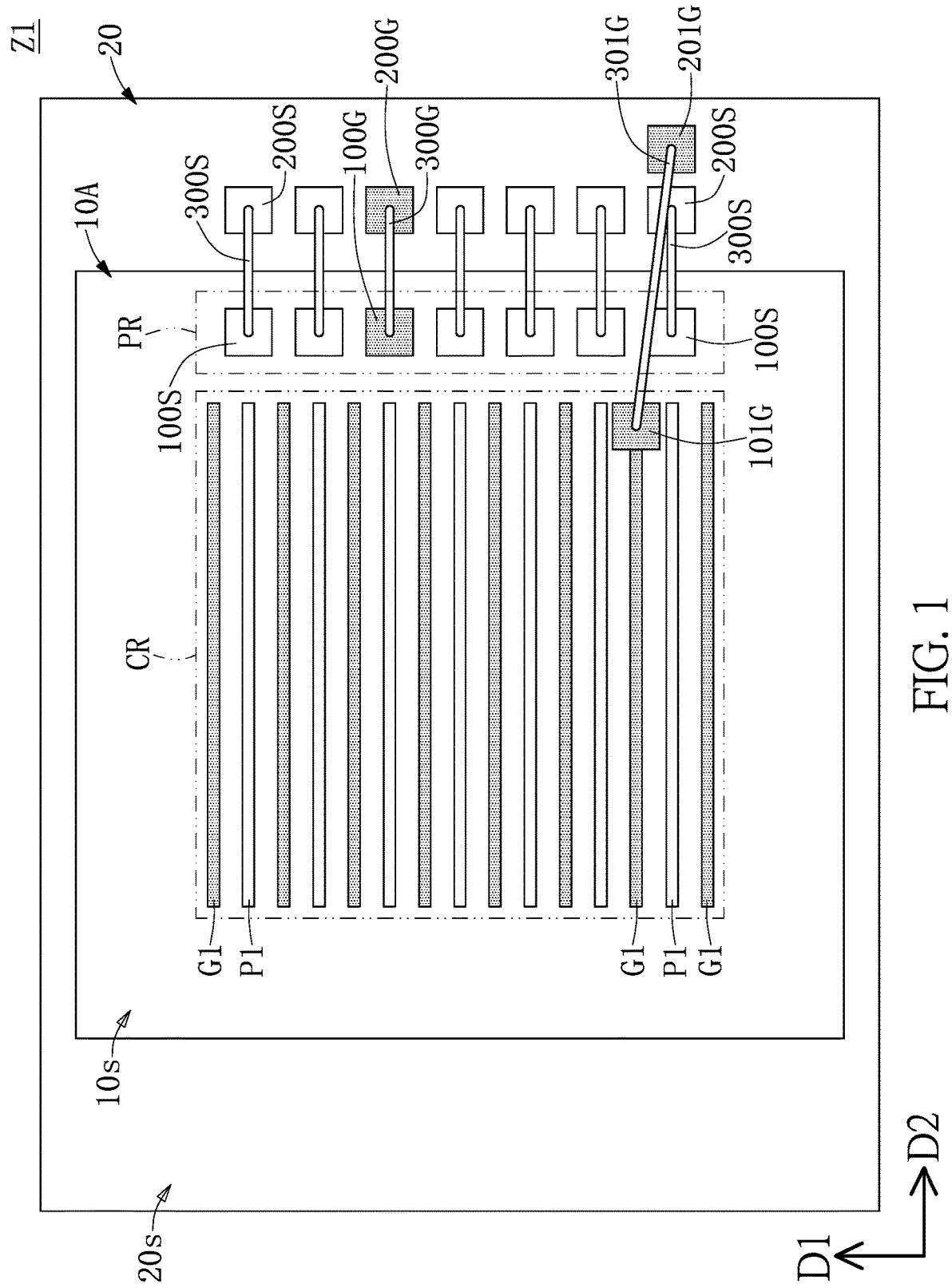
FIG. 1 is a partial and schematic top view of an electronic package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
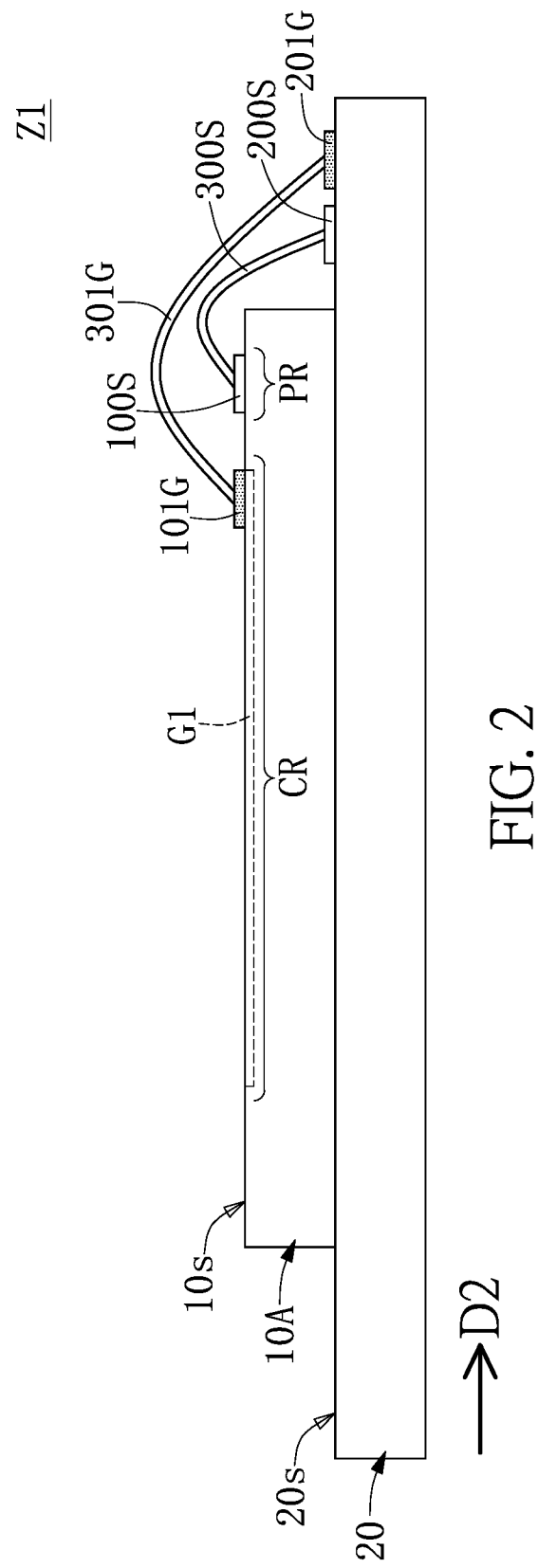
FIG. 2 is a partial and schematic sectional view of an electronic package structure according to the first embodiment of the present disclosure.

Reference is made to FIG. 1 to FIG. 2, a first embodiment of the present disclosure provides an electronic package structure Z1, and the electronic package structure Z1 includes a chip 10A, a substrate 20, a plurality of signal wires 300S and at least one core ground wire 301G.

The chip 10A can be a system on chip (SoC), a micro processing chip, a dynamic RAM (random access memory) chip or the other kinds of devices, the present disclosure is not limited thereto. The chip 10A is disposed on and electrically connected to the substrate 20. In the instant embodiment, a top surface 10S of the chip 10A is disposed with a core wiring region CR, an input and output pad region PR, a plurality of signal pads 100S, and at least one core ground pad 101G.

The core wiring region CR is located at a central portion of the top surface 10s of the chip 10A, and the input and output pad region PR is located at a periphery of the core wiring region CR. To be more specific, the input and output pad region PR is located between the core wiring region CR and an edge of the chip 10A. It should be noted that in the instant embodiment, only the portion of the input and output pad region PR that is located at one side of the core wiring region CR is illustrated for the sake of brevity. In another embodiment, the input and output pad region PR may surround the core wiring region CR.

As shown in FIG. 1, the signal pads 100S are arranged in the input and output pad region PR. Furthermore, according to the functions of the chip 10A, the signal pads 100S can be defined as different signal terminals, such as a VCC pad, a VDD pad, a VSS pad, a power supply pad, a clock-signal pad, an address signal pad, and so on. In one embodiment, the chip 10A further includes at least one ground pad 100G, and the at least one ground pad 100G and the signal pads 100S are arranged in the input and output pad region PR.

In another embodiment, the chip 10A can include a plurality of ground pads 100G and a plurality of signal pads 100S, and the ground pads 100G and the signal pads 10S can be arranged in a pad array. Specifically, the ground pads 100G and the signal pads 100S are arranged in "m" columns in a direction (a first direction D1) that is parallel to an edge of the chip 10A and arranged in "n" rows in another direction (a second direction D2) that is perpendicular to the edge of the chip 10A.

It should be noted that the pad array shown in FIG. 1 has been simplified to explain and clarify the concept of the present disclosure, and is not to be taken as the pad array to be used in practical application. That is to say, only the signal pads 100S and the ground pads 100G which are arranged in one column along one of the sides of the core wiring region CR are illustrated in FIG. 1.

Furthermore, the core ground pad 101G is arranged in the core wiring region CR and adjacent to at least one of the signal pads 100S. Specifically, the core ground pad 101G would be arranged adjacent to one of the signal pads 100S that requires shielding. In the embodiment shown in FIG. 1, if, in the pad array arranged in the input and output pad region PR, one of the signal pads 100S that is farthest away from the ground pad 100G most requires shielding than other ones of the signal pads 100S, the core ground pad 101G would be arranged at a position that is closest to the one of the signal pads 100S.

In other words, a linear distance between the core ground pad 101G and the signal pad 100S to be shielded is the shorter than the linear distance between any one of other signal pads 100S and the core ground pad 101G. In one embodiment, the aforementioned linear distance can be defined as a shortest distance between two geometrical centers of two pads, such as the core ground pad 101G and the signal pad 100S.

In the instant embodiment, the chip 10A further includes a plurality of ground traces G1 and a plurality of power traces P1 that are disposed in the core wiring region CR, and the ground traces G1 and the power traces P1 are alternately arranged.

In one embodiment, the ground traces G1 and the power traces P1 are arranged in substantially the same direction as the arrangement direction of the signal pads 100S. However, the extending direction of any of the ground traces G1 and the power traces P1 is not parallel to the arrangement direction of the signal pads 100S. For example, as shown in FIG. 1, in the input and output pad region PR, the signal pads 100S are arranged in at least one column in the first direction D1. The ground traces G1 and the power traces P1 are alternately arranged in the first direction D1, and extend along the second direction D2. Furthermore, the core ground pad 101G is disposed at the end portion of one of the ground traces G1 that is closest to the signal pad 100S to be shielded, the end portion is near the input and output pad region PR.

However, in another embodiment, the extending direction of each of the ground traces G1 and the power traces P1 can be substantially parallel to the arrangement direction of the signal pads 100S. That is to say, all of the ground traces G1 and the power traces P1 extend along the first direction D1, and the ground traces G1 and the power traces P1 are alternately arranged in the second direction D2.

Under the circumstance, the core ground pad 101G is still disposed at one of the ground traces G1 that is closest to the signal pad 100S to be shielded. However, it is not necessary for the core ground pad 101G to be arranged at the end portion of the one of the ground traces G1. That is to say, the position of the core ground pad 101G on the one of the ground traces G1 can be adjusted according to the position of the signal pad 100S to be shielded. Accordingly, the core ground pad 101G can be arranged at a middle portion of the one of the ground traces G1.

Reference is made to FIG. 1. The substrate 20 can be a printed circuit board, a ceramic board, a metal board or a composite board. In the instant embodiment, the substrate 20 is a printed circuit board and has a supporting surface 20s. The chip 10A is disposed on the supporting surface 20s. The substrate 20 includes a plurality of traces (not shown in the figure) that has been configured therein and a plurality of contact pads disposed on the supporting surface 20s. As shown in FIG. 1, the arrangements of the contact pads respectively correspond to the positions of the signal pads 100S, the ground pads 100G and the core ground pad 101G. Accordingly, in the instant embodiment, the contact pads can be divided into the signal contact pads 200S, the first ground contact pad(s) 200G and the second ground contact pad(s) 201G.

Furthermore, as shown in FIG. 1, the electronic package structure Z1 further includes a plurality of signal wires 300S, at least one ground wire 300G, and at least one core ground wire 301G. Each of the signal pads 100S is electrically connected to the corresponding one of the signal contact pads 200S on the substrate 20 through the corresponding signal wire 300S. The ground pad 100G is electrically connected to the corresponding first ground contact pad 200G on the substrate 20 through the corresponding ground wire 300G. Furthermore, the core ground pad 101G is electrically connected to the corresponding second ground pad 201G through the corresponding core ground wire 301G.

Accordingly, in the instant embodiment, the signal pads 100S, the ground pad 100G, and the core ground pad 101G of the chip 10A are electrically connected to the circuit of the substrate 20 respectively through the corresponding signal wires 300S, the corresponding ground wires 300G, and the corresponding core ground wires 301G.

However, in another embodiment, the signal pads 100S, the ground pad 100G, and the core ground pad 101G can be electrically connected to another electronic component respectively through the corresponding signal wires 300S, the corresponding ground wires 300G, and the corresponding core ground wires 301G. Accordingly, in the present disclosure, the chip 10A is not limited to be only electrically connected to the substrate 20.

It should be noted that in the instant embodiment, both the ground pad 100G located in the input and output pad region PR and the ground wire 300G connected thereto are electrically connected to a ground plane of the substrate 20. Accordingly, the ground pad 100G and the ground wire 300G connected thereto can shield the signal wire 300S that is adjacent to the ground wire 300G to attenuate the crosstalk among the signal wires 300S. However, since the number of the signal pads 100S is greater than that of the ground pads 100G, not all of the signal wires 300S can be shielded by the ground wire 300G.

Accordingly, in the embodiment of the present disclosure, at least one core ground pad 101G disposed in the core wiring region CR and at least one core ground wire 301G connected thereto are provided so as to shield at least one of signal pads 100S and the signal wire 300S connected thereto. Therefore, as shown in FIG. 1 and FIG. 2, the core ground wire 301G is disposed adjacent to one of the signal wires 300S to be shielded.

In one embodiment, the signal transmission result of each of the signal wires 300S can be obtained by conducting a simulation. Thereafter, according to the signal transmission results of simulations, the signal pad 100S that most requires shielding and the signal wire 300S connected thereto can be determined. To be more specific, the core ground pad 101G and the core ground wire 301G connected thereto can provide shielding for the signal wire 300S and the signal pad 100S connected thereto with a worst transmission quality. As such, the crosstalk can be attenuated and the signal transmission quality can be improved.

In the embodiment shown in FIG. 1, in the same column, if the signal pad 100S that is farthest away from the ground pad 100G and the signal wire 300S connected thereto have a worst transmission quality, the core ground pad 101G is arranged to be adjacent to the signal pad 100S that is farthest away from the ground pad 100G. However, in another embodiment, according to the signal transmission results, the signal pad 100S that is farthest away from the ground pad 100G (and the signal wire 300S connected thereto) is not always the one that most requires shielding. Accordingly, the position and number of the core ground pad 101G can be adjusted according to actual requirements and are not limited in the present disclosure.

It should be noted that since the ground traces G1 and the power traces P1 are arranged in the core wiring region CR, no matter whether the core wiring region CR is disposed with the core ground pad 101G or not, the core wiring region CR occupies a certain area of the chip 10A.

Accordingly, when the core ground pad 101G is disposed in the core wiring region CR, a space where the core ground pad 101G can be disposed will not need to be increased (i.e., by increasing the size of the chip 10A). That is to say, in the present disclosure, by disposing the core ground pad 101G in the core wiring region CR and the core ground wire 301G connected thereto, the crosstalk among the signal wires 300S can be attenuated without increasing the size of the chip 10A.

The aforementioned effect is especially significant for a pad array in which the ratio of the number of the signal pads 100S to the number of the ground pads 100G is relative larger, by using the technique provided in the present disclosure. Furthermore, the number of the core ground pads 101G can be greater than or equal to that of the ground pads 100G.

Second Embodiment

Figure 3:
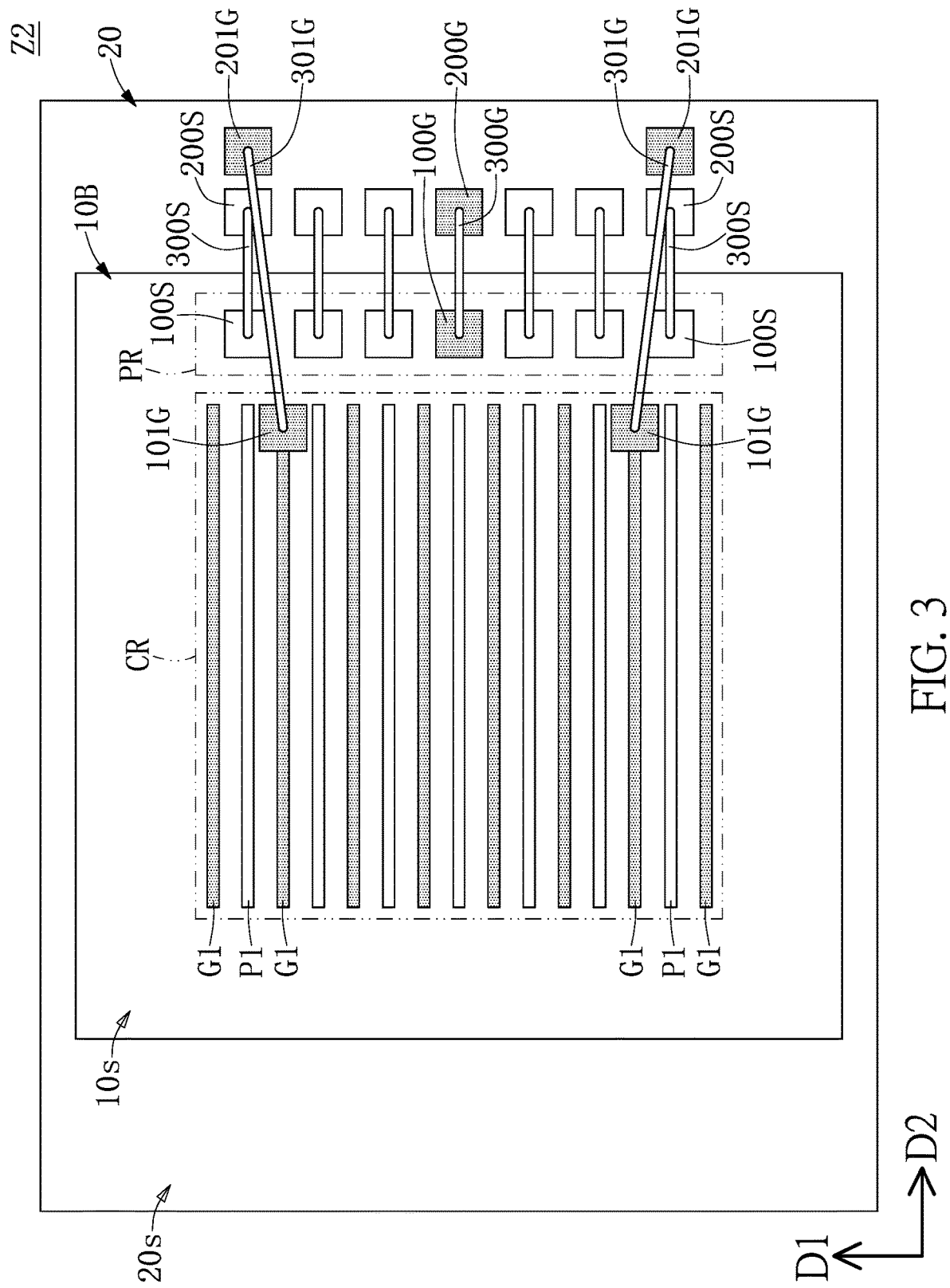
FIG. 3 is a partial and schematic top view of an electronic package structure according to a second embodiment of the present disclosure.

Reference is made to FIG. 3. The elements in the electronic package structure Z2 of the instant embodiment which are the same as or similar to those in the electronic package structure Z1 of the first embodiment are denoted to the same or similar reference numerals, and the same descriptions will not be reiterated herein. In the instant embodiment, two core ground pads 101G are disposed in the core wiring region CR of the chip 10B, and the two core ground pads 101G are respectively connected to two second ground pads 201G disposed on the substrate 20 through two core ground wires 301G, respectively. Furthermore, two core ground pads 101G are respectively disposed at two different ground traces G1 and respectively adjacent to two signal pads 100S requiring shielding.

Accordingly, two core ground pads 101G and two core ground wires 301G respectively connected thereto can provide shielding for two different signal wires 300S. That is to say, the positions and the numbers of the core ground pads 101G and the core ground wires 301G can be adjusted according to actual requirements, and are not limited in the present disclosure.

Third Embodiment

Figure 4:
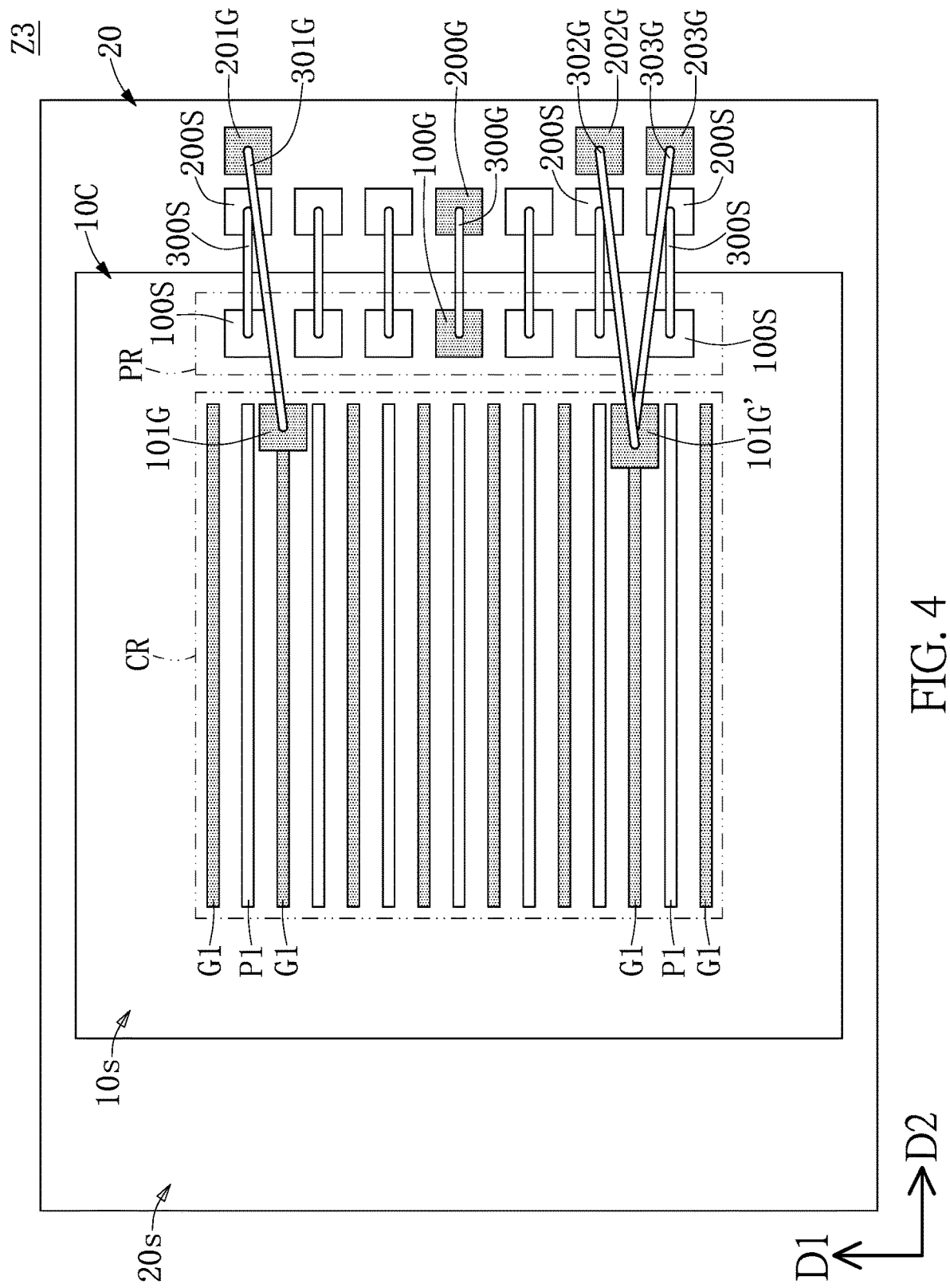
FIG. 4 is a partial and schematic top view of an electronic package structure according to a third embodiment of the present disclosure.

Reference is made to FIG. 4. The elements in the electronic package structure Z3 of the instant embodiment which are the same as or similar to those in the electronic package structure Z2 of the second embodiment are denoted to the same or similar reference numerals, and the same descriptions will not be reiterated herein. In the instant embodiment, two core ground pads 101G, 101G' are disposed in the core wiring region CR of the chip 10C. One (101G') of the core ground pads 101G, 101G' is arranged at a position corresponding to two adjacent signal pads 100S. From a top view, as shown in FIG. 4, an area of the shape of the core ground pad 101G' is greater than that of the shape of the other core ground pad 101G. That is to say, the area occupied by the core ground pad 101G' is greater than the area occupied by the other core ground pad 101G.

In the instant embodiment, the number of the core ground wires 301G is larger than the number of the core ground pads 101G. Specifically, the electronic package structure Z3 includes three core ground wires 301G. One of the core ground wires 301G is connected to one of the core ground pads 101G, and other core ground wires 302G, 303G are connected to the other core ground pad 101G', the area of which is relatively larger from the top view. Accordingly, the two core ground wires 302G, 303G which are connected to the same core ground pad 101G' can provide shielding for different signal wires 300S, respectively.

Furthermore, the substrate 20 includes three second ground contact pads 201G, 202G, 203G. One (201G) of the second ground pads is arranged at a position corresponding to the core ground pad 101G, and the other second ground contact pads 202G, 203G are arranged at two positions corresponding to another core ground pad 101G'. Accordingly, the core ground pad 101G is connected to the corresponding second ground pad 201G through the corresponding core ground wire 301G, and another core ground pad 101G' is connected to the two second ground contact pads 202G, 203G respectively through two corresponding core ground wires 302G, 303G.

That is to say, by increasing the area of one of the core ground pads 101G, 101G' from the top view, the number of the core ground wires 301G can be increased without increasing the number of the core ground pads 101G so as to provide shielding for more signal wires 300S. Accordingly, in the embodiment of the present disclosure, the core ground pad 101G is not limited to be connected to only one core ground wire.

Fourth Embodiment

Figure 5:
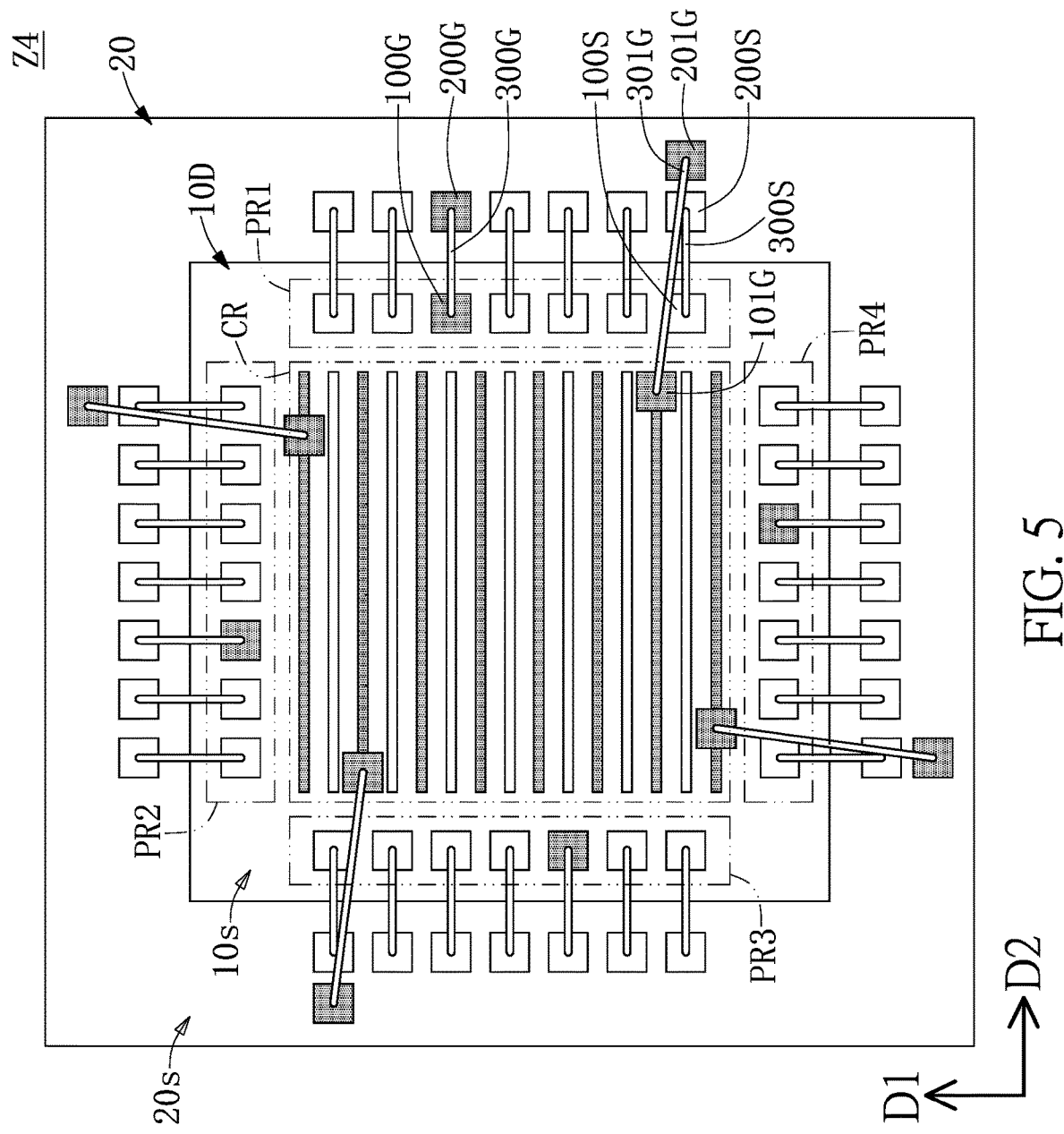
FIG. 5 is a partial and schematic top view of an electronic package structure according to a fourth embodiment of the present disclosure.

Reference is made to FIG. 5. The elements of the electronic package structure Z4 which are similar to or the same as those of the electronic package structure Z1 are denoted by similar or the same reference numerals, and will not be reiterated herein. In the instant embodiment, the input and output pad region PR of the chip 10D includes a plurality of sub-regions PR1-PR4 that surrounds the core wiring region CR. The signal pads 100S and the ground pads 100G are divided into a plurality of pad groups, and each of the pad groups is disposed in the corresponding one of the sub-regions PR1-PR4.

Specifically, the input and output pad region of the instant embodiment includes four sub-regions PR1-PR4 which are spaced apart from one another, and the four sub-regions PR1-PR4 are respectively adjacent to the four sides of the core wiring region CR.

Furthermore, the chip 10D further includes a plurality of core ground pads 101G (four of which are illustrated in FIG. 5), and each of the core ground pads 101G is closer to the corresponding one of the four sides of the core wiring region CR so as to shield at least one of the signal pads 100S that is arranged in the corresponding one of the sub-regions PR1-PR4. Accordingly, in the instant embodiment, the core ground pads 101G can be disposed on different ground traces G1, and the positions of the core ground pads 101G respectively correspond to the signal pads 100S that require shielding.

The substrate 20 includes a plurality of second ground pads 201G, and the second ground pads 201G are disposed on the supporting surface 20s and located at the positions that respectively correspond to the core ground pads 101G. In the instant embodiment, the second ground pads 201G are respectively adjacent to four sides of the chip 10D. Furthermore, each of the core ground pads 101G is connected to the corresponding one of the second ground pads 201G through the corresponding core ground wire 301G. Accordingly, each of the core ground pads 101G and the core ground wire 301G that are connected thereto can provide shielding for the corresponding signal pads 100S and the signal wires connected thereto so as to attenuate the crosstalk.

In conclusion, one of the advantages of the present disclosure is that in an electronic package structure and a chip thereof, by the technical features of "the core ground pad 101G being disposed in the core wiring region CR and being adjacent to at least one of the signal pads 100S," the core ground pad 101G and the core ground wire 301G that is connected thereto can jointly shield one of the signal pads 100S and one of the signal wires 300S that is connected thereto, thereby substantially maintaining the signal integrity without increasing the size of the chip.

To be more specific, in the instant embodiment, rather than increasing the number of the ground pad 100G in the input and output pad region PR, the crosstalk can be attenuated by disposing the core ground pad 101G in the core wiring region CR and configuring the core ground wire 301G to be connected to the core ground pad 101G. Accordingly, a space where the core ground pad 101G can be disposed will not need to be increased (i.e., by increasing the size of chip 10A.) As such, the signal transmission quality can be improved without increasing the cost of the chip.

Furthermore, in the present disclosure, the positions and the numbers of the core ground pads 101G and core ground wires 300S connected thereto can be determined according to the positions and the numbers of the signal pads 100S and the signal wires 300S that most require shielding. By using the core ground pads 101G in cooperation with the ground pads 100G, even if the number of the ground pad 100G is less than that of the signal pad 100S, the crosstalk can be attenuated and the signal transmission quality can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic package structure, comprising:
   a substrate;
   a chip disposed on and electrically connected to the substrate, wherein a top surface of the chip is disposed with a core wiring region and an input and output pad region, the input and output pad region is located between the core wiring region and an edge of the chip, and the chip includes:
      a plurality of signal pads disposed in the input and output pad region; and
      a core ground pad disposed in the core wiring region and being adjacent to at least one of the signal pads;
   a plurality of signal wires respectively connected to the signal pads; and
   a core ground wire connected to the core ground pad, wherein the core ground wire is adjacent to at least one of the signal wires so as to shield the at least one of the signal wires.

2. The electronic package structure according to claim 1, wherein the chip further includes at least a ground pad, the ground pad and the signal pads are jointly disposed in the input and output pad region and arranged in at least one row along a side of the core wiring region, and the core ground pad is adjacent to one of the signal pads that is the farthest away from the ground pad.

3. The electronic package structure according to claim 1, wherein the signal pads are arranged in at least one row along a side of the core wiring region, and the core ground pad is disposed corresponding to two adjacent ones of the signal pads.

4. The electronic package structure according to claim 3, further comprising: another core ground wire, wherein the core ground wire and the another core ground wire are both connected to the core ground pad so as to respectively shield two of the signal wires that are adjacent to each other.

5. The electronic package structure according to claim 1, wherein the chip further includes a plurality of ground traces and a plurality of power traces, the ground traces and the power traces are alternately arranged in the core wiring region, and the core ground pad is disposed on one of the ground traces.

6. The electronic package structure according to claim 1, wherein the input and output pad region includes a plurality of sub-regions that surround the core wiring region, the signal pads are divided into a plurality of pad groups, and each of the pad groups is disposed in the corresponding one of the sub-regions.

7. The electronic package structure according to claim 6, wherein the chip further includes:
   a plurality of core ground pads disposed in the core wiring region and near a side of the core wiring region, wherein each of the core ground pads is adjacent to one of the signal pads that is located in the corresponding one of the sub-regions.

8. A chip comprising:
   a core wiring region disposed at a top surface of the chip;
   an input and output pad region disposed at the top surface of the chip and located between the core wiring region and an edge of the chip;
   a plurality of signal pads disposed in the input and output pad region;
   a core ground pad disposed in the core wiring region and adjacent to one of the signal pads; and
   at least one ground pad, wherein the at least one ground pad and the signal pads are disposed in the input and output pad region and arranged in at least one row along a side of the core wiring region;
   wherein the core ground pad is adjacent to one of the signal pads that is the farthest away from the ground pad.

9. The chip according to claim 8, further comprising a plurality of ground traces and a plurality of power traces, wherein the ground traces and the power traces are alternately arranged in the core wiring region, and the core ground pad is disposed on one of the ground traces.

10. The chip according to claim 8, wherein the input and output pad region includes a plurality of sub-regions that surround the core wiring region, the signal pads are divided into a plurality of pad groups, and each of the pad groups is arranged in the corresponding one of the sub-regions.

11. The chip according to 10, further comprising: a plurality of other core ground pads disposed in the core wiring region and near sides of the core wiring region, wherein the core ground pad and the other core ground pads are each adjacent to the corresponding one of the signal pads that is located in the corresponding one of the sub-regions.

12. The chip according to claim 8, further comprising: another core ground pad disposed in the core wiring region, and an area occupied by the core ground pad is different from an area occupied by the another ground pad.

13. A chip comprising:
   a core wiring region disposed at a top surface of the chip;
   an input and output pad region disposed at the top surface of the chip and located between the core wiring region and an edge of the chip;
   a plurality of signal pads disposed in the input and output pad region;
   a core ground pad disposed in the core wiring region and adjacent to one of the signal pads; and
   a plurality of ground traces and a plurality of power traces, wherein the ground traces and the power traces are alternately arranged in the core wiring region, and the core ground pad is disposed on one of the ground traces.

* * * * *